United States Patent
Chiu et al.

(10) Patent No.: US 7,492,179 B2
(45) Date of Patent: Feb. 17, 2009

(54) SYSTEMS AND METHODS FOR REDUCING TESTING TIMES ON INTEGRATED CIRCUIT DIES

(75) Inventors: Chien-Jung Chiu, Tainan (TW); Hsing-Ya Huo, Kaohsiung (TW); Tsung-Yu Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 11/279,240

(22) Filed: Apr. 10, 2006

(65) Prior Publication Data

US 2007/0236238 A1 Oct. 11, 2007

(51) Int. Cl.
*G01R 31/26* (2006.01)
(52) U.S. Cl. .................................. 324/765
(58) Field of Classification Search ............ 324/765, 324/719, 158.1; 702/57
See application file for complete search history.

(56) References Cited

U.S. PATENT DOCUMENTS 7,212,580 B2 * 5/2007 Hietala et al. ............... 375/293
7,253,650 B2 * 8/2007 Balchiunas ................. 324/763
2004/0204858 A1 * 10/2004 Brumbaugh ................. 702/13
2007/0007981 A1 * 1/2007 Golan ........................ 324/765

OTHER PUBLICATIONS

Anthony T. McCray, James McNames, and David Abercrombie, Locating Disturbances in Semiconductor Manufacturing With Stepwise Regression, Aug. 2005, IEEE Transactions on semiconductror Manufacturing, vol. 18, No. 3, pp. 458-468.*
Balchiunas, Akiko, "Increasing Productivity at Wafer Test Using Probe Data Analysis," IBM Microelectronics, Jun. 8, 2004.

* cited by examiner

*Primary Examiner*—Ha Tran T Nguyen
*Assistant Examiner*—Shaun Campbell
(74) *Attorney, Agent, or Firm*—Baker & McKenzie LLP

(57) ABSTRACT

Disclosed herein are various embodiments of systems and method for testing dies on semiconductor wafers that reduce testing times on future wafers. The disclosed systems and methods may be employed to determine which BINs, if any, should be reprobed during a second testing pass. Specifically, the disclosed principles provide this determination based on the relationship between the yield recovery rate of a single BIN in view of the recovery rate for all BINs on the wafer, and the reprobe rate of that single BIN in view of the reprobe rate for all of the BINs. With this approach, both the recovery rate and the reprobe rate for a single BIN are evaluated as a percentage of the recovery rate or reprobe rate for all of the BINs on the wafer.

20 Claims, 2 Drawing Sheets

| BINs | REPROBE(%) | YIELD RECOVERY RATE(%) |
|---|---|---|
| +:14 ... | 97.15 | 62 |
| +:34 | 96.15 | 62 |
| +:75 | 95.48 | 62 |
| +:11 | 95.21 | 62 |
| +:27 | 53.55 | 58 |
| +:32 | 53.30 | 58 |
| +:31 | 52.81 | 58 |
| +:6 | 52.33 | 58 |
| +:51 | 51.19 | 57 |
| +:19 | 50.87 | 57 |
| +:26 | 50.39 | 57 |
| +:22 | 49.47 | 57 |
| +:81 | 48.64 | 57 |
| +:23 | 48.44 | 57 |
| +:50:24 | 48.21 | 56 |
| +:29 | 47.95 | 56 |
| +:10 | 47.57 | 56 |
| +:21 | 7.23 | 29 |
| +:20 | 6.74 | 28 |
| +:15 | 6.66 | 28 |
| +:53 | 2.99 | 25 |
| ⋮ | ⋮ | ⋮ | ns
SYSTEMS AND METHODS FOR REDUCING TESTING TIMES ON INTEGRATED CIRCUIT DIES

TECHNICAL FIELD

Disclosed embodiments herein relate generally the testing of integrated circuit dies on semiconductor wafers, and more particularly to systems and method for testing dies on semiconductor wafers to determine which BINs of defective dies, if any, should be reprobed with a second testing pass to recover defective dies, thereby reducing testing times on future wafers.

BACKGROUND

The fabrication of various solid state devices employs semiconductor wafers on which semiconductor integrated circuits or other devices are fabricated. The final number, or yield, of functional integrated circuits on a wafer at the end of the fabrication process is of utmost importance to semiconductor manufacturers, and increasing the yield of circuits on the wafer is a primary goal of semiconductor fabrication. After manufacturing, wafer "dies" having the integrated circuits are tested so that non-functional dies are identified. In order to detect defects on a wafer, electrical tests are used to thoroughly and accurately determine the existence and location of defects. The electrical tests may be conducted by simply determining whether the circuitry is functional or defective, and if defective, in what way is the circuitry defective.

In addition, a certain amount of retesting of the dies previously found to be defective is also conducted. When these dies are retested, many may be found to be operational during the second test pass, and are thus "recovered" to increase wafer yield. In traditional testing processes, all dies on a baseline wafer set are tested during a first test pass, and then the dies found to be defective are identified are typically retested to establish a recovery rate for certain types detected defects. Then, an engineer or other employee of the manufacturer manually determines which type of detected error is most worthwhile to retest. Specifically, the engineer would typically choose to retest only those types of defective dies that have a good history of recovery during the second test, for example, a 25% recovery rate or better. Unfortunately, manual selection for wafer reprobing is not always accurately accomplished, and mistakes may occur when resetting the testing equipment for reprobing. In addition, the expense of having an engineer handle the reprobing can be costly on the manufacturer.

SUMMARY

Disclosed herein are various embodiments of systems and method for testing dies on semiconductor wafers that reduce testing times on future wafers. The disclosed systems and methods may be employed to determine which BINs, if any, should be reprobed during a second testing pass. Specifically, the disclosed principles provide this determination based on the relationship between the yield recovery rate of a single BIN in view of the recovery rate for all BINs on the wafer, and the reprobe rate of that single BIN in view of the reprobe rate for all of the BINs. With this approach, both the recovery rate and the reprobe rate for a single BIN are evaluated as a percentage of the recovery rate or reprobe rate for all of the BINs on the wafer.

In one embodiment, a method of testing dies on semiconductor wafers comprises testing all dies on a test wafer set, wherein dies that fail the testing are categorized into BINs corresponding to a reason the dies failed the testing, and then retesting all the dies that failed the testing in order to identify all dies that pass the retesting within each BIN. In addition, the method includes calculating a recovery rate for each BIN based on the identified dies in each BIN that pass the retesting versus all the dies retested, as well as determining a reprobe rate for each BIN based on a time used for retesting dies in a BIN versus a total time for retesting all the dies that failed the testing. In such embodiments, the method further includes establishing a threshold recovery rate per reprobe rate, and identifying BINs having a recovery rate per reprobe rate exceeding the threshold. Such a method still further includes testing all dies on non-test wafers, wherein dies that fail the testing are categorized into the corresponding BINs, and retesting only the dies on the non-test wafers categorized into the identified BINs.

BRIEF DESCRIPTION OF THE DRAWINGS

For a more complete understanding of the principles disclosed herein, and the advantages thereof, embodiments are illustrated by way of example in the following figures in which like reference numbers indicate similar parts, and in which.

DETAILED DESCRIPTION

Figures 1, 2:
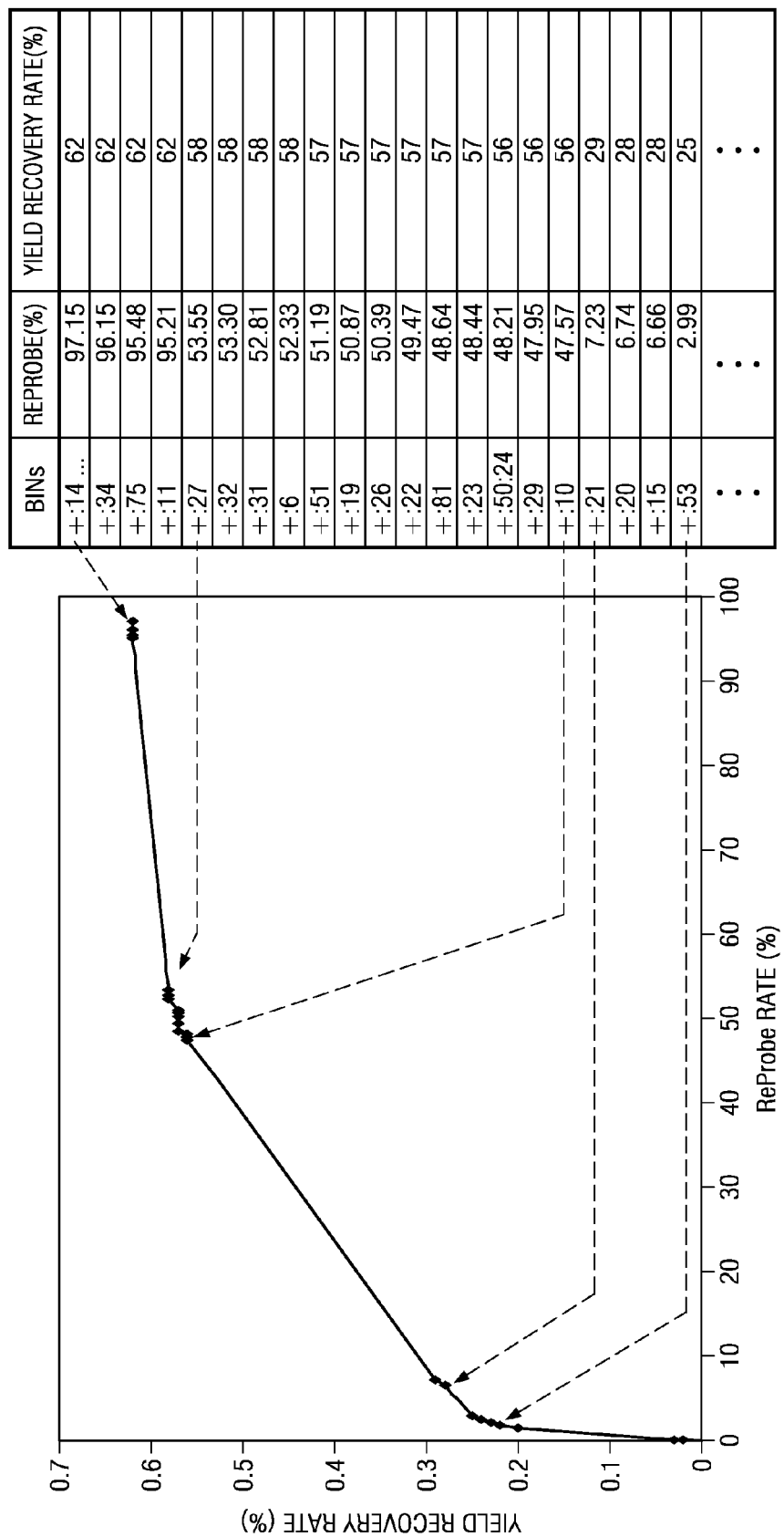
FIG. 1 illustrates a table having multiple columns holding exemplary data for a wafer testing process conducted in accordance with the disclosed principles.
FIG. 2 illustrates a plot of the data from the table in FIG. 1, where the yield recovery rate of dies on the tested wafers is plotted as a function of the reprobe rate.

The disclosed systems and processes for testing integrated circuit dies on semiconductor wafers are first described with reference to FIG. 1 and FIG. 2 together. FIG. 1 illustrates a table having multiple columns holding exemplary data for a wafer testing process conducted in accordance with the disclosed principles. FIG. 2 illustrates a plot of the data from the table in FIG. 1, where the yield recovery rate of dies on the tested wafers is plotted as a function of the reprobe rate.

Before describing the disclosed process in detail, some terms use throughout this disclosure should first be defined. First, the term "BIN" is used to describe a group or collection of dies found to be faulty during a first test pass. For example, if 3000 dies are tested on a semiconductor wafer and 100 of those dies are determined to be faulty for the same reason (e.g., current leakage, contact open, contact short-circuits, etc.), then those 100 dies would be considered in the same BIN, such as "BIN 53." In this sense, a BIN is similar to an error code, and a die's placement in a particular BIN explains what was found to be wrong with that die during the first test pass. Next, the term "yield recovery rate" (or simply "recovery rate") means the percentage of dies determined to be functional during a second test pass of the total dies previously determined to be faulty during a first test pass. As used herein, the recovery rate is BIN-specific such that a separate recovery rate is determined for each of the error BINs identified during the first test pass.

Finally, the term "reprobe rate" is also BIN-specific, and means the time taken to reprobe a specific BIN as a percentage of the entire time taken to reprobe all the BINs of the wafer. For example, if the die testing involved with a particular BIN is somewhat time-consuming, the retesting of the dies in that particular BIN may actually represent 50% of the total retesting time for all the BINs on the wafer. Additionally, this may be the case not only if the testing procedure for that type of BIN is very time consuming as compared to others, but also if the sheer number of dies in the BIN to be retested occupies a great deal of the total retesting of all the bad dies. As a result, for the reprobing of this exemplary BIN to be efficient, the recovery rate for this BIN should be relatively high, in accordance with the principles disclosed herein.

With these terms in mind, attention is now turned to the disclosed technique of determining which BINs, if any, should be reprobed during a second testing pass. Specifically, the disclosed principles provide this determination based on the relationship between the yield recovery rate of a single BIN in view of the recovery rate for all BINs on the wafer, and the reprobe rate of that single BIN in view of the reprobe rate for all of the BINs. With this approach, both the recovery rate and the reprobe rate for a single BIN are evaluated as a percentage of the recovery rate or reprobe rate for all of the BINs on the wafer. The table and plot of FIG. 1 and FIG. 2 illustrate this approach in greater detail.

The table in FIG. 1 provides data for all of the BINs identified on an exemplary type of wafer. As in conventional approaches, the disclosed approach begins with a first test pass of all dies on a particular semiconductor wafer in order to establish a baseline for that type (e.g., the types of circuits) of wafer using a baseline wafer set. In exemplary embodiments, 100 wafers may be selected as the baseline wafer set from which testing parameters in accordance with the disclosed technique may be established. In addition, the dies on wafers to be tested may be any type of semiconductor device or circuit, such as logic, memory, CMOS, and the like. The first test pass consists of testing the functionality of the various dies with one or more types of tests. For example, the dies may be tested for leakage current, contact opens, contact short-circuits, or any other type of beneficial functionality test. Other examples of possible tests include, but are not limited to, scan test, BISt test, PLL test, boundary test, Idd/Iddq test, static/dynamic current test, and DSP scan test. Once all of these various types of tests are completed, the dies that failed the first pass testing are organized into BINs based on the reason for failing the testing. The number of BINs, and hence the number of various functionality tests, is not limited to any particular number or type. The table in FIG. 1 includes a column illustrating all of the BINs that may be identified in a typical testing procedure conducted according to the disclosed principles. As mentioned above, these BINs identify failed dies based on the type of failure experienced by those dies during the first pass testing (e.g., leakage current, contact opens, contact short-circuits, etc.

The next step in the disclosed process is to then retest all of the bad dies of the baseline wafers to determine which of the dies that failed first pass testing are actually good, functional dies. Then, based on the retesting of the bad dies, a recovery rate for these first test pass failures is calculated based on the good dies found on the retesting (i.e., the second pass test) of all the dies that were retested. In addition, the time required to retest each particular BIN may also be measured and recorded, if desired. The number of dies reprobed for each BIN is then compared against the total number of reprobed dies for the entire reprobing procedure for all of the identified BINs. Through this comparison, a reprobe rate for each BIN is calculated, which is the percentage of the entire reprobe time that is taken to reprobe one particular BIN. The second column of the table in FIG. 1 includes the reprobe rate for each of the BINs identified and recorded in the first column. Thus, as may be seen from this column, the actual reprobe time is not necessarily important, but rather it is the percentage of the total reprobe time for all bad dies that is considered.

However, in accordance with the disclosed principles, when the reprobe rate is calculated for each BIN, it is recorded in the table as a stepwise cumulative percentage of the total reprobe time for all of the BINs. As used herein, "stepwise cumulative" means, for example, the reprobe rate for BIN:53 (at the bottom of the table) is 2.99% of the total time required to reprobe all of the failed dies in all of the BINs identified by the first test pass. Thus, it is not necessarily important whether the reprobe time for BIN:53 is 5 minutes or 5 hours, but rather that is about 3% of the total reprobe time for all bad dies. Then, moving up the table, the reprobe rate for BIN:15 and BIN:53 is 6.66% of the total reprobe time. Thus, the reprobe rate for only BIN:15 is 3.67% (6.66%-2.99%). Moving up the table again, the reprobe rate for BIN:20, BIN:15 and BIN:53 is 6.74% of the total reprobe time; thus, the reprobe time for BIN:20 is only 0.08% of the total reprobe time. The stepwise cumulative reprobe rate for each of the remaining BINs is also calculated in this manner, moving up the table. By calculating the stepwise cumulative reprobe rate, rather than focusing on only the individual reprobe rate for each distinct BIN, large jumps in the overall reprobe time required for a wafer can be identified.

These large jumps are used to identify which particular BINs are occupying a large percentage of the total reprobe time (i.e., a large reprobe rate for that BIN), which is then used to determine if a large enough number of previously failed dies are being recovered (i.e., a corresponding large recovery rate) in exchange for the large amount of retesting time required for that BIN. For example, the table in FIG. 1 clearly shows a large jump in reprobe rate for BIN:10. Before BIN:10 is considered in the reprobe rate, the stepwise cumulative reprobe rate for all of the prior BINs (BINs:53, :15, :20: and :21) represents only 7.23% of the reprobe time. However, when considering BIN:10 in the reprobe time, the stepwise cumulative reprobe rate jumps to 47.57% of the total reprobe time taken during the second test pass. Thus, BIN:10 has a reprobe rate of 40.34%, almost one half of the total time taken to reprobe all of the identified BINs.

As with the reprobe rate, the stepwise cumulative recovery rate for corresponding BINs is illustrated in the third column of the table in FIG. 1. Specifically, the percentage of recovered dies on retesting of each BIN is illustrated next to each identified BIN, and is stepwise cumulative moving up the table. For example, for BIN:53, which represents 2.99% of the total retesting time, experiences a recovery rate of 25%. This means that out of all of the dies that are recovered from all of the BINs that are retested (i.e., the second test pass) on the baseline wafers, 25% of those recovered dies are dies identified in BIN:53 during the first test pass. Stated another way, the retesting of BIN:53 occupies only 2.99% of the total retesting time, but retesting this particular BIN recovers 25% of the recovered dies. Similarly, the retesting of BINs:53 and :15 occupies 6.66% of the retesting time, with a stepwise cumulative recovery rate of 28%. This means that the retesting of BIN:15 results in recovering only 3% of the retested dies, yet occupies 3.67% of the reprobe time. Thus, regardless of what testing threshold is selected, it is clear that it is far more efficient to retest BIN:53 over BIN:15 based on the recovery rate achieved per each BIN's reprobe rate.

As with the recording of the stepwise cumulative reprobe rates, recording the corresponding stepwise cumulative recovery rates identifies jumps in the recovery rate, which identifies which BINs experience large die recovery versus others of the BINs. For example, for BIN:10, which was identified through the table as occupying a large percentage of the reprobe time, has a stepwise cumulative recovery rate of 56%. However, before considering BIN:10, the stepwise cumulative recovery rate for all the prior BINs was 29%; thus, the retesting of BIN:10 results in a recovery rate of about 27%. Stated another way, BIN:10 requires over 40% of the total reprobe time for the wafer, but results in a recovery of only 27% of the dies recovered during retesting. As a result, the retesting of BIN:10 may not prove to be efficient to the retesting process, depending on the thresholds selected by the manufacture employing the disclosed technique.

The next step in the disclosed process is to establish the threshold parameters for what is acceptable (and what is not) when comparing the reprobe rate of a particular BIN (or group of BINs) with a recovery rate. In exemplary embodiments, the setting of a particular threshold is an arbitrary decision for each manufacturer, with no specific threshold being correct or incorrect. In other embodiments, the threshold may be established after a comparison of the stepwise cumulative reprobe rates and the corresponding stepwise cumulative recovery rates. The plot illustrated in FIG. 2 provides such a comparison. More specifically, a distinct point is plotted of the stepwise cumulative reprobe rate as a function of the stepwise cumulative recovery rate, when each BIN is considered (moving up the table). By plotting the stepwise cumulative rates in the illustrated manner, the plot provides visual evidence of retesting efficiency across the various BINs.

For example, for the plot in FIG. 2, the slope of the line connecting each of the plotted points (for each BIN) can inform the manufacturer about the efficiency of retesting certain BINs. Specifically, in this embodiment, the higher the slope of the line (i.e., the closer to vertical), the more efficient the retest should be for those BINs. Conversely, the lower the slope of the plotted line (i.e., the closer to horizontal), the less efficient the retest would likely be for those BINs. Thus, in the illustrated embodiment, it may be seen that the line from the origin to the plot for BIN :53 is relatively vertical, while the line connecting the plots of BINs:15, :20, and :21, and the line connecting the plot of BIN:21 and that of BIN:10, are much more horizontal. As a result, these slopes illustrate that the recovery rate for these latter BINs may not be worth the amount of reprobe time retesting these particular BINs requires. Even worse retesting efficiency is illustrated by the lines connecting the plots for BIN:27 and the remainder of the BINs, which is very horizontal when compared to other areas of the plot. The inefficiency of retesting these BINs may be confirmed by the data in FIG. 1, where is can be seen that BINs:11 and up occupy about 43.6% of the reprobe time, while only offering a recovery rate of only about 4%. Thus, the manufacturer would strongly consider not including these BINs in the retesting of wafers based on this inefficiency. It should be noted that the top row of BINs actually represents BINs:14, :54, :55, :56, :57, :58, :59, :98, :60, :25, :61, :62, :64, :65, :66, :67, :68, :69, :1, :30, :33, :71, :72, :73, :74, :88, and :89, which were too numerous to list on the table in FIG. 1.

In addition to the slope of a line being used to determine retesting efficiency, a computer may be employed to determine a first order derivative or take a tangent of a given plot or group of plots. Even multiple tangents may be taken into consideration to determine optimum retesting points. Based on these results, no matter generated, the threshold may be determined from the plot, which in this case would likely result in the canceling of the retesting of all BINs after BIN: 21. This is because at this point the retesting process, a recovery rate of 29% can be had for only 7.23% of the retesting time. However, if the remaining BINs are added into the retesting process, all of that additional reprobing time only provides an additional recovery rate of 33%, which may not be worth the time and expense of such retesting. Of course, any threshold may be established using the disclosed technique, and not limit to any particular one should be inferred. In addition, any combination of retesting or not retesting of certain BINs may be selected using the disclosed technique depending on the needs of each manufacturer.

As may be seen from the above, the disclosed technique provides the manufacturer with stepwise cumulative reprobe rates compared against stepwise cumulative recovery rates for all of the BINs identified on the baseline test wafers. This data that is generated using the test wafer set may then be used to create an algorithm, which would also include a threshold for deciding whether to retest a certain BIN or BINs on production wafers. A computer-readable storage medium contains this set of instructions for testing dies on semiconductor wafers. For example, to decide whether a specific BIN should be retested, a break-even point (from a cost point-of-view) of the type of wafer being tested may first be determined. Then, this data may be compared with an established acceptable yield-loss for that particular wafer type. Of course, other factors may also be considered. Moreover, this algorithm may be automated such that once the data from the baseline wafer set is generated, a computer running the algorithm automatically adjusts the reprobing equipment to only reprobe BINs that the algorithm has determined are economically efficient to retest. Not only does such an algorithm according to the disclosed principles reduce overall wafer testing time by efficiently streamlining the retesting process, but such an algorithm also eliminates the need for an engineer to examine the first pass test results of the baseline wafers, and then manually adjust the retest process based on his observations. As a result, the retesting process is further streamlined by employing the speed of an automated system for automatically adjusting the retesting procedure as described herein. Moreover, more than one algorithm may be employed with the disclosed technique to automate the streamlining process, and the one or more algorithms may even employ two or more different sets of data, even if the testing is being done on only one probing system.

Figure 3:
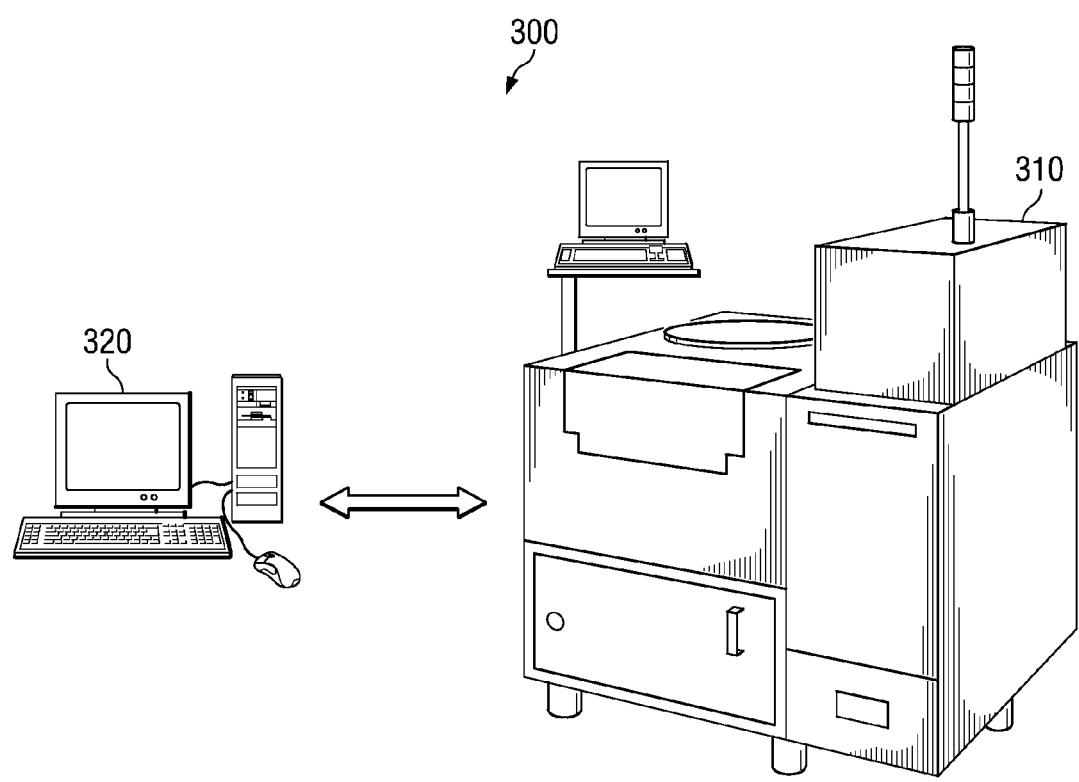
FIG. 3 illustrates a simplified diagram of one embodiment of a system for testing dies on semiconductor wafers designed in accordance with the disclosed principles.

Turning briefly to FIG. 3, illustrated is a simplified diagram of one embodiment of a system 300 for testing dies on semiconductor wafers designed in accordance with the disclosed principles. The system 300 includes testing equipment 310 for testing the functionality of integrated circuit dies on semiconductor wafers. The testing equipment 310 is typically a probing device having conducting probes configured to contact select areas of the dies on the wafers in order to perform electrical testing on the circuit within those dies. Of course, any type of probing device may be employed with the disclosed system 300.

The system 300 also includes a computer 320 connected to the wafer testing equipment 310. The computer 320 is configured to execute program code to conduct the disclosed wafer testing process discussed in detail above. The testing equipment may be configured to test all the dies on non-test (i.e., production) wafers during a first test pass, where dies that fail the testing are categorized into the corresponding BINs. Then, in exemplary embodiments, when the computer 320 is executing the code to control the testing equipment 310, the equipment 310 may be automatically updated by the computer 320 to retest only the dies on production wafers categorized into the identified BINs. Through such automatic updating, the wafer testing system 300 is able to dynamically adjust the testing of future production wafers to eliminate the retesting of certain BINs to more efficiently conduct the testing process by determining using the disclosed process which BINs do not have an efficient recovery rate.

While various embodiments of the disclosed technique have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of testing dies on semiconductor wafers, the method comprising:
   testing all dies on a test wafer set, wherein dies that fail the testing are categorized into BINs corresponding to a reason the dies failed the testing;
   retesting all the dies that failed the testing in order to identify all dies that pass the retesting within each BIN;
   calculating a recovery rate for each BIN based on the identified dies in each BIN that pass the retesting versus all the dies retested;
   determining a reprobe rate for each BIN based on a time taken for retesting dies in a certain BIN versus a total time for retesting all the dies that failed the testing;
   establishing a threshold recovery rate per reprobe rate;
   identifying BINs having a recovery rate per reprobe rate exceeding the threshold;
   testing all dies on non-test wafers, wherein dies that fail the testing are categorized into the corresponding BINs; and
   retesting only the dies on the non-test wafers categorized into the identified BINs such that dies in BINs comprising a recovery rate greater than the threshold per a reprobe rate faster than the threshold are retested.

2. A method according to claim 1, wherein the calculating a recovery rate for each BIN comprises calculating stepwise cumulative recovery rates for all BINs.

3. A method according to claim 2, wherein the determining a reprobe rate for each BIN comprises determining stepwise cumulative reprobe rates for all BINs.

4. A method according to claim 3, further comprising plotting points representing the stepwise cumulative recovery rates for all the BINs as a function of the stepwise cumulative reprobe rates for corresponding BINs.

5. A method according to claim 4, wherein establishing a threshold comprises selecting an acceptable line slope, and wherein identifying BINs having a recovery rate per reprobe rate exceeding the threshold comprises comparing slopes of lines connecting the plotted points to the acceptable line slope.

6. A method according to claim 1, wherein identifying BINs comprises automatically identifying BINs having a recovery rate per reprobe rate exceeding the threshold in response to the establishing of a threshold recovery rate per reprobe rate.

7. A method according to claim 1, wherein the testing and retesting comprises testing and retesting for current leakage, contact opens, contact short-circuits, scan test, BISt test, PLL test, boundary test, ldd/lddq test, static/dynamic current test, or DSP scan test.

8. A computer-readable storage medium containing a set of instructions for testing dies on semiconductor wafers, the set of instructions comprising code for:
   testing all dies on a test wafer set, wherein dies that fail the testing are categorized into BINs corresponding to a reason the dies failed the testing;
   retesting all the dies that failed the testing in order to identify all dies that pass the retesting within each BIN;
   calculating a recovery rate for each BIN based on the identified dies in each BIN that pass the retesting versus all the dies retested;
   determining a reprobe rate for each BIN based on a time taken for retesting dies in a certain BIN versus a total time for retesting all the dies that failed the testing;
   establishing a threshold recovery rate per reprobe rate;
   identifying BINs having a recovery rate per reprobe rate exceeding the threshold;
   testing all dies on non-test wafers, wherein dies that fail the testing are categorized into the corresponding BINs; and
   retesting only the dies on the non-test wafers categorized into the identified BINs such that dies in BINs comprising a recovery rate greater than the threshold per a reprobe rate faster than the threshold are retested.

9. A computer-readable storage medium according to claim 8, wherein the calculating a recovery rate for each BIN comprises calculating stepwise cumulative recovery rates for all BINs.

10. A computer-readable storage medium according to claim 9, wherein the determining a reprobe rate for each BIN comprises determining stepwise cumulative reprobe rates for all BINs.

11. A computer-readable storage medium according to claim 10, wherein the set of instructions further comprise plotting points representing the stepwise cumulative recovery rates for all the BINs as a function of the stepwise cumulative reprobe rates for corresponding BINs.

12. A computer-readable storage medium according to claim 11, wherein establishing a threshold comprises selecting an acceptable line slope, and wherein identifying BINs having a recovery rate per reprobe rate exceeding the threshold comprises comparing slopes of lines connecting the plotted points to the acceptable line slope.

13. A computer-readable medium according to claim 8, wherein identifying BINs comprises automatically identifying BINs having a recovery rate per reprobe rate exceeding the threshold in response to the establishing of a threshold recovery rate per reprobe rate.

14. A computer-readable medium according to claim 8, wherein the testing and retesting comprises testing and retesting for current leakage, contact opens, contact short-circuits, scan test, BISt test, PLL test, boundary test, ldd/lddq test, static/dynamic current test, or DSP scan test.

15. A system for testing dies on semiconductor wafers, the system comprising:
   testing equipment configured to test all dies on test wafers, wherein dies that fail the testing are categorized into BINs corresponding to a reason the dies failed the testing, and to retest all the dies that failed the testing in order to identify all dies that pass the retesting within each BIN; and
   a computer connected to the testing equipment and configured to execute a computer-readable medium containing a set of instructions comprising code for:
      calculating a recovery rate for each BIN based on the identified dies in each BIN that pass the retesting versus all the dies retested,
      determining a reprobe rate for each BIN based on a time taken used retesting dies in a certain BIN versus a total time for retesting all the dies that failed the testing, and
      identifying BINs having a recovery rate per reprobe rate exceeding a threshold recovery rate per reprobe rate; and
   wherein the testing equipment is farther configured to test all dies on non-test wafers, wherein dies that fail the testing are categorized into the corresponding BINs, and wherein the set instructions further comprise code for automatically updating the testing equipment to retest only the dies on non-test wafers categorized into the identified BINs such that dies in BINs comprising a recovery rate greater than the threshold per a reprobe rate faster than the threshold are retested.

16. A system according to claim 15, wherein the calculating a recovery rate for each BIN comprises calculating stepwise cumulative recovery rates for all BINs.

17. A system according to claim 16, wherein the determining a reprobe rate for each BIN comprises determining stepwise cumulative reprobe rates for all BINs.

18. A system according to claim 17, wherein the set of instructions further comprise plotting points representing the stepwise cumulative recovery rates for all the BINs as a function of the stepwise cumulative reprobe rates for corresponding BINs.

19. A system according to claim 18, wherein establishing a threshold comprises selecting an acceptable line slope, and wherein identifying BINs having a recovery rate per reprobe rate exceeding the threshold comprises comparing slopes of lines connecting the plotted points to the acceptable line slope.

20. A system according to claim 15, wherein the reason a die failed the testing is current leakage, contact open, contact short-circuit, scan test, BISt test, PLL test, boundary test, ldd/lddq test, static/dynamic current test, or DSP scan test.

* * * * *